(12) United States Patent
Kondo et al.

(10) Patent No.: US 6,728,052 B2
(45) Date of Patent: Apr. 27, 2004

(54) RECORDING/REPRODUCING APPARATUS, ERROR CORRECTING CODING METHOD AND INFORMATION RECORDING METHOD

(75) Inventors: Masaharu Kondo, Odawara (JP); Terumi Takashi, Chigasaki (JP)

(73) Assignee: Hitachi, Ltd., Tokyo (JP)

( * ) Notice: Subject to any disclaimer, the term of this patent is extended or adjusted under 35 U.S.C. 154(b) by 337 days.

(21) Appl. No.: 09/888,645

(22) Filed: Jun. 26, 2001

(65) Prior Publication Data
US 2002/0060873 A1 May 23, 2002

(30) Foreign Application Priority Data
Oct. 6, 2000 (JP) ........................... 2000-313121

(51) Int. Cl.[7] ................................. G11B 5/09
(52) U.S. Cl. ........................... 360/53; 714/784
(58) Field of Search ................ 360/77.01, 40, 360/53; 369/45; 714/780–783, 784; 371/71.5

(56) References Cited

U.S. PATENT DOCUMENTS

| 5,408,477 A | * | 4/1995 | Okada et al. ............. 714/755 |
| 5,422,895 A | * | 6/1995 | Nguyen et al. ........... 714/756 |
| 6,052,820 A | * | 4/2000 | Yoshida .................... 714/781 |

FOREIGN PATENT DOCUMENTS

| JP | 10232099 | 9/1998 |
| JP | 11119191 | 4/1999 |
| JP | 11139698 | 5/1999 |

* cited by examiner

Primary Examiner—David Hudspeth
Assistant Examiner—Glenda P. Rodriquez
(74) Attorney, Agent, or Firm—Antonelli, Terry, Stout & Kraus, LLP

(57) ABSTRACT

A recording/reproducing apparatus for recording in a recording medium the interleaved data with an error correcting code added thereto and reproducing the recorded data from the recording medium, wherein the error correcting coding process is performed using an elliptic code on a finite field $GF(2^m)$ where m is a positive integer.

7 Claims, 6 Drawing Sheets

POINT GENERATOR

POINT GENERATOR

RECORDING/REPRODUCING APPARATUS, ERROR CORRECTING CODING METHOD AND INFORMATION RECORDING METHOD

BACKGROUND OF THE INVENTION

The present invention relates to an error correcting coding method used with the recording/reproducing apparatus.

The Reed-Solomon code is used for the recording/reproducing apparatus such as the magnetic disk device, the magneto-optic disk device and the compact disk device. The magnetic disk device uses the Reed-Solomon code on the finite field $GF(2^8)$ including $2^8$ elements which is a set wherein the four rules of arithmetic are defined (except for "division by 0") mutually by the elements, where GF is an abbreviation of Galois Field. The error correcting coding and the error correcting process for the recording/reproducing apparatus are performed with eight bits of the Reed-Solomon code as one symbol providing a unit for calculation.

In the Reed-Solomon code, it is known that the code having the maximum number t of correction symbols can be configured by setting the number of redundant symbols to 2t. The length of the sector providing a unit for performing each recording/reproducing operation is 512 symbols. In view of the fact that the length of the Reed-Solomon code that can be configured on $GF(2^8)$ is 255 (=$2^8-1$) symbols or less, data are divided (interleaved) into three or more blocks and then an error correcting code is provided for each block.

One of the advantages of the Reed-Solomon code is that the symbol positions for calculation are arranged, from the most significant place of the code, as $\alpha^{n-1}, \alpha^{n-2}, \ldots, \alpha^2, \alpha^1, \alpha^0$ ($\alpha$: primitive root of finite field), so that the symbol position for calculation can be regularly calculated by the multiplier alone at the time of the Chien search for the error position for decoding. The Chien search is a method for searching for a solution of an equation by substituting the elements into the equation sequentially.

SUMMARY OF THE INVENTION

Consider the case in which the Reed-Solomon code on $GF(2^8)$ is used for a recording system of 512 symbols per sector. In view of the fact that the code length is not more than $2^8-1=255$ symbols and the relation holds that 512/255>2, the problem is that the number of interleaves cannot be reduced below 3.

As long as the maximum number of correction symbols per sector is constant, the smaller the number of interleaves, the higher the error correcting ability of the code.

With the error correcting coding method according to this invention, an elliptic code on $GF(2^m)$ is used to configure a code longer than $2^m-1$ and therefore the number of interleaves can be reduced.

For configuring the code having the maximum number t of correction symbols by the elliptic code, the number of redundant symbols is set to 2t+1. The number of redundant symbols for this code is 287−256=31, and therefore the maximum number of correction symbols is given as 15 (15×2+1=31). The use of this code makes it possible to configure 512 bytes per sector in two interleaves. The principle of the error correcting coding method according to this invention will be explained below.

Assume that $E(C, GF(2^m))$ for the elliptic curve C: $y^2+a_1xy+a_3y+a_0x^3+a_2x^2+a_4x+a_6=0$ on $GF(2^m)$ indicates the following set, $\epsilon$ is the number of elements of $E(C, GF(2^m))$ and $a_0, a_1, a_2, a_3, a_4, a_6$ are constants.

$$E(C, GF(2^m))=\{(\alpha, \beta) \in GF(2^m)^2 | \beta^2+a_1\alpha\beta+a_3\beta+a_0\alpha^3+a_2\alpha^2+a_4\alpha+a_6=0\} \quad (1)$$

$\cup\{o:$ point at infinity$\}$ where if the points associated with $E(C, GF(2^m))\setminus\{o\}$ are assigned the numbers $p^{(1)}, p^{(2)}, \ldots, p^{(\epsilon-1)}$, the code word of the elliptic code is defined as a column vector w satisfying Hw=0 for the matrix H of equation (2).

$$H = (h_{i,j})_{\substack{1\le i\le n-k \\ 1\le j\le n}}, \quad h_{i,j} = v_{i-1}(p^{(j)}), \quad (2)$$

$$\begin{pmatrix} v_0(x,y)=1, \ v_1(x,y)=x, \ v_2(x,y)=y, \\ v_{j+2}=v_1(x,y)v_j(x,y) \quad \text{for } j \ge 1 \end{pmatrix}$$

Especially, the code length n coincides with $\epsilon-1$. The elliptic curve C which satisfies the relation $n>2^m-1$ can be found by total search of the values of the coefficient $a_j$.

With the definition of equation (2), however, the code word cannot be calculated by other than the method of solving an equation, and therefore the process is very complicated. The calculation can be facilitated by regular matrix operation of the code word by rewriting the equation (2) as follows.

Specifically, assume that the vector with k symbols arranged in column before coding is $w_0$. When H satisfies equation (3), $Gw_0$ constitutes a code word for the matrix G of equation (4). As a matter of fact, the relation is obtained that $H(Gw_0)=M^{-1}(MH)(Gw_0)=M^{-1}((MH)G)w_0=0$.

$$\exists M: \text{square matrix s.t. } MH=(H_1|I) \quad (3)$$

$$G = \begin{bmatrix} I \\ H_1 \end{bmatrix} \quad (4)$$

, where I represents an identity matrix. If $H_1$ can be calculated from equation (5), the redundant symbol of the corresponding code word $Gw_0$ can be calculated from $w_0$.

$$Gw_0 = \begin{bmatrix} I \\ H_1 \end{bmatrix} w_0 = \begin{bmatrix} w_0 \\ H_1 w_0 \end{bmatrix} \quad (5)$$

Equation (6) can be obtained from equation (3). As long as M is calculated and stored in advance, therefore, $H_1$ can be calculated. Thus, the redundant symbol of the code word $Gw_0$ can also be calculated from $w_0$.

$$H_1 = (h^*_{i,j})_{\substack{1\le i\le n-k \\ 1\le j\le k}}, \quad h^*_{i,j} = v_{i-1}(p^{(j)}), \quad (6)$$

$$\begin{pmatrix} V_0(x,y) \\ V_1(x,y) \\ \vdots \\ V_{n-k-1}(x,y) \end{pmatrix} = M \begin{pmatrix} v_0(x,y) \\ v_1(x,y) \\ \vdots \\ v_{n-k-1}(x,y) \end{pmatrix}$$

In order to give the regularity to $E(C, GF(2^m))\setminus\{o\}$, an arithmetic circuit for realizing the calculation $+_o$ as defined in equation (7) is built in and used.

$O+_oP=P+_oO=P$ for $P\in E(C,GF(2^m))$, $(x_1,y_1)+_o(x_1,y_1+a_1x_1+a_3)=0$, $(x_1,y_1)+_o(x_2,y_2)=(x_3,y_3)$ $(x_1\ne x_2$ or $y_2\ne y_1+a_1x_1+a_3)$ $$\begin{cases} x_3 = \lambda^2 + a_1\lambda + a_2 + x_1 + x_2, \\ y_3 = (\lambda + a_1)x_3|v| - a_3, \\ \begin{cases} \lambda = \dfrac{x_1^2 + a_4 + a_1 y_1}{a_1 x_1 + a_3}, \\ v = \dfrac{x_1^3 + a_1 x_1 + a_3 y_1}{a_1 x_1 + a_3} \end{cases} (x_1 = x_2 \text{ and } y_2 \neq y_1 + a_1 x_1 + a_3) \\ \begin{cases} \lambda = \dfrac{x_1^3 + a_4 + a_1 y_1}{a_1 x_1 + a_3}, \\ v = \dfrac{x_1^3 + a_4 x_1 + a_3 y_1}{a_1 x_1 + a_3} \end{cases} (x_1 \neq x_2) \end{cases} \quad (7)$$

For the element P of E(C, GF ($2^m$)), P $+_0, \ldots, +_0$P (involving Ps in the number of m) is expressed as [m] P.

The recording/reproducing apparatus according to this invention based on the aforementioned principle is for recording in a recording medium the interleaved data with an error correcting code added thereto and reproducing the recorded data from the recording medium, the apparatus comprising an error correcting decoding circuit for generating an error correcting code using an elliptic code on a finite field GF($2^m$) (m: positive integer).

DESCRIPTION OF THE EMBODIMENTS

Figure 2:
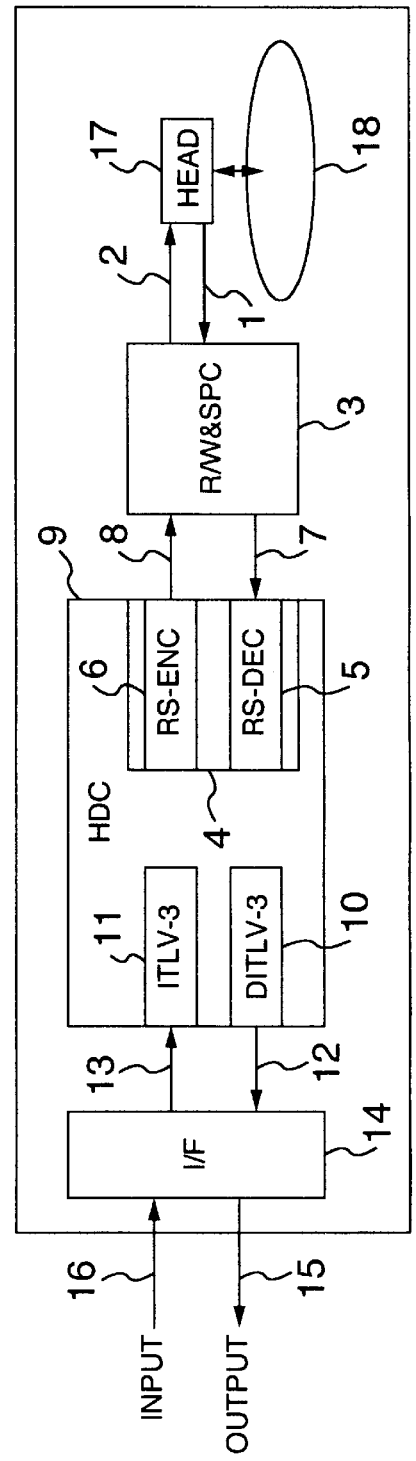
FIG. 2 is a block diagram showing a magnetic disk apparatus using an error correcting coding method based on the Reed-Solomon code.

FIG. 2 is a schematic diagram showing a magnetic disk device employing an error correcting coding method based on the Reed-Solomon code. A sector of input signals 16 is converted to a sector of binary data by an interface (I/F) 14. A sector of binary data 13 is applied to a hard disk controller 9, and segmented into three data blocks by an interleaver (ITLV-3) 11 in the hard disk controller 9. An error correction code is generated for each segmented data block by a Reed-Solomon coding circuit (RS-ENC) 6.

The data block 8 for which the error correcting code is generated is converted by a signal processing LSI (R/W & SPC) into an analog signal to be recorded in the magnetic disk 18 by a magnetic head. The analog signal is sent to a head 17. The signal 1 read from the head 17 is equalized or otherwise subjected to the signal processing such as Viterbi decoding by the signal processing LSI 3, and by being discriminated into 0 and 1 levels, converted to binary data. After conversion, the binary data 7 is applied to the hard disk controller 9, and an error is detected and corrected for each decoded block of the symbol length subjected to the error correcting coding, by the Reed-Solomon decoding circuit (RS-DEC) 5.

The three code blocks decoded are combined with each other by a deinterleaver (DITLV-3), so that a sector of binary data is restored. A sector of the binary data thus restored is converted to a signal 15 for output by the I/F 14.

This embodiment employs the Reed-Solomon coding/decoding LSI circuit having the RS-DEC 5 and the RS-ENC 6 in a single chip. As an alternative, however, the encoder and the decoder may be mounted in different chips.

Figure 1:
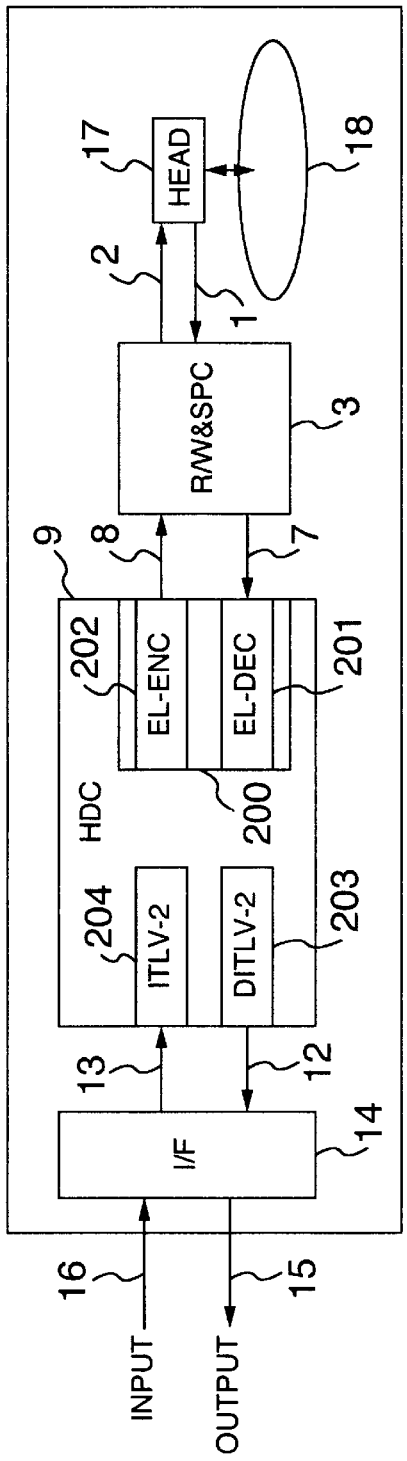
FIG. 1 is a block diagram showing a magnetic disk apparatus using an error correcting coding method according to the present invention.

FIG. 1 shows a magnetic disk device using the error correcting coding method according to an embodiment of the invention. In FIG. 1, the same reference numerals as those of FIG. 2 designates component elements having the same functions as the corresponding component elements in FIG. 2, respectively.

A sector of input signal 16 having 512 symbols is converted to a sector of binary data by an interface (I/F) 14 for performing the analog-to-digital (A/D) conversion. A sector of the binary data 13 is applied to the hard disk controller 9, and segmented into two data blocks by the interleaver (ITLV-2) 204 included in the hard disk controller 9. The error correcting coding operation is performed for each converted and segmented data block by the elliptic coding circuit 202 providing coding means. The data block 8 thus subjected to the error correcting and coding operation is converted to an analog signal 2 by the signal processing LSI (R/W & SPC) 3, and applied to the head 17. The signal thus sent is recorded in the magnetic disk 18 providing a recording medium.

The signal 1 read from the magnetic disk 18 by the head 17, on the other hand, is converted to binary data by the signal processing LSI 3. After conversion, the binary data 7 is applied to the disk controller 9, and an error is detected and corrected for each error corrected/coded code block of the symbol length by the elliptic decoding circuit 5 included in the disk controller 9. The two decoded code blocks are coupled by the deinterleaver (DITLV-2) 10 and a sector of binary data is restored. A sector of the binary data 12 thus restored is converted to the output signal 15 by the I/F 14.

In the embodiment shown in FIG. 1, the elliptic coding circuit 202 and the elliptic decoding circuit 201 may be formed either on a single IC chip or on different IC chips.

Figure 3:
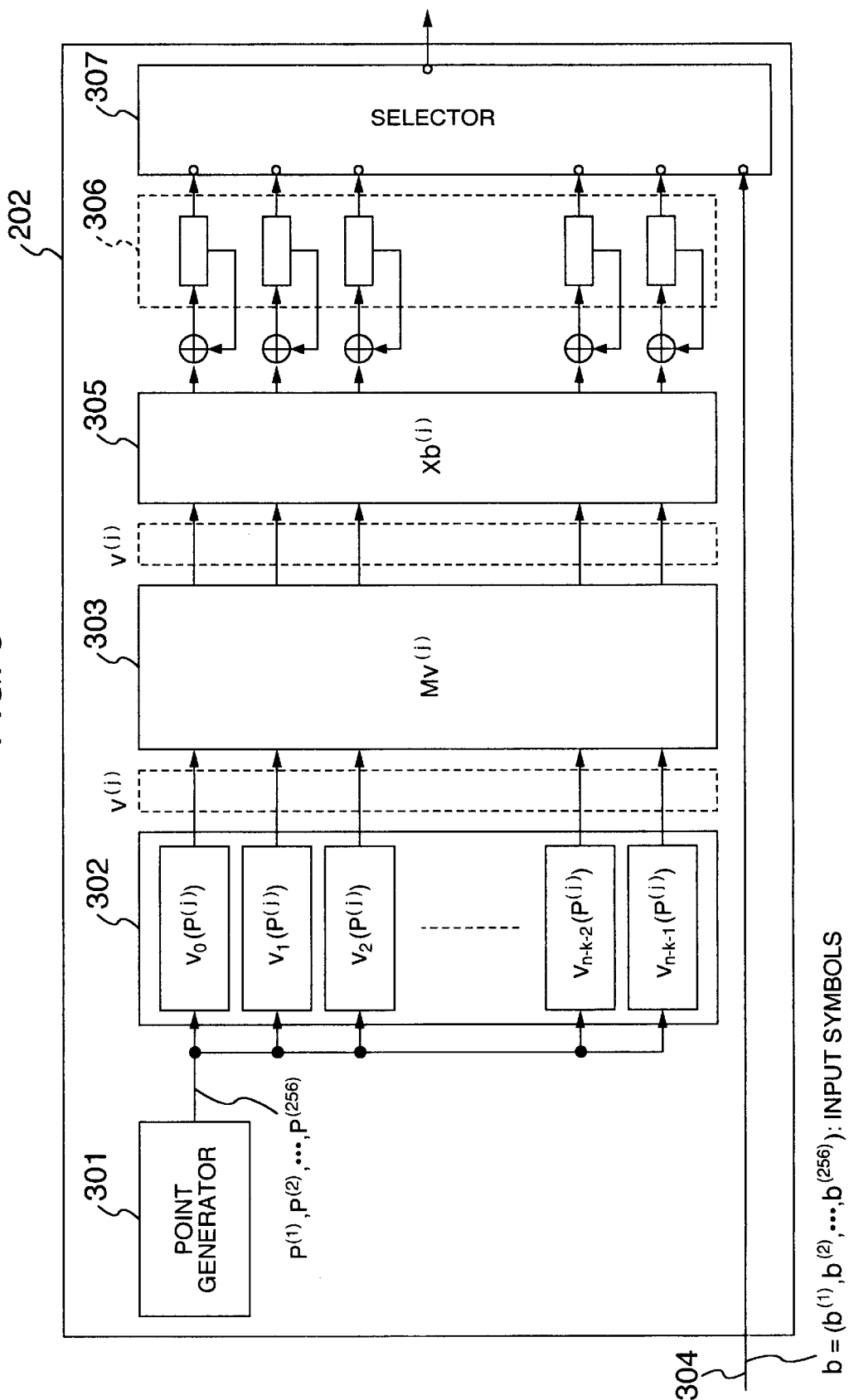
FIG. 3 is a block diagram showing a specific example of the elliptic coding circuit of FIG. 1.

FIG. 3 is a block diagram specifically showing the elliptic coding circuit (EL-ENC) 202. An input symbol train $b^{(1)}$, $b^{(2)}, \ldots, b^{(256)}$ is input by way of an input terminal 304. A rational point generator 301 outputs a point $P^{(J)}$ at a timing when $b^{(j)}$ is input. With the point $P^{(J)}$ as an input, a vector generating circuit 302 outputs a vector $v^{(J)}$. With the point $P^{(J)}$ as an input, the matrix calculation circuit 303 outputs the vector $V^{(J)}$. With the vector $V^{(J)}$ and symbol $b^{(J)}$ as an input, a scalar multiplier 305 outputs $b^{(J)}V^{(J)}$. The output $b^{(J)}V^{(J)}$ is added to and stored in the memory 306 for storing the redundant symbols. At the same time, $b^{(j)}$ is passed through a selector 307 freely. After the processing of 256 symbols, the selector 307 selectively outputs, in descending order, the contents of the memory 306 in which the redundant symbols are stored.

In the case where the input $P^{(j)}=(\alpha_j, \beta_j, 1)$, the output of the vector generating circuit 302 is obtained from equation (2) as 1, $\alpha_j$, $\beta_j$, $\alpha_j^2$, $\alpha_j\beta_j$, $\ldots$, in the descending order.

An explanation will be given of an example of preparation for the parameter calculation in decoding the elliptic code $((n, k)=(287, 256))$ on $GF(2^8)$ taking the systematic coding into consideration. The code having the maximum number $t$ of correction symbols can be configured of the elliptic code by setting the number of redundant symbols to $2t+1$. The number of redundant symbols of this code is $287-256=31$, and therefore the maximum number of correction symbols is $15 (15 \times 2+1=31)$. By using this code, a sector of 512 bytes can be configured in two interleaves.

Assume that $\alpha$ is the primitive root of $GF(2^8)$ satisfying the relation $\alpha^8+\alpha^4+\alpha^3+\alpha^2+1=0$, and that the elliptic code configured of the elliptic curve $C_1$: $y^2+\alpha^4 xy+\alpha^{25} y+x^3+\alpha^{29}=0$ is used.

By checking by total search whether a point on $C_1$ is involved or not, it is found that $\epsilon=288$ for $E(C_1, GF(2^8))$. For realizing the $+o$ arithmetic circuit, assume that the input/output corresponding to $o$ is $(0, 0, 0)$ and the input/output for the point $(\alpha_0, \beta_0)$ not $o$ is $(\alpha_0, \beta_0, 1)$. The contents of calculation of the $+_o$ arithmetic circuit is configured as $(a_1, a_3, a_0, a_2, a_4, a_6)=(\alpha^4, \alpha^{25}, 1, 0, 0, \alpha^{29})$ in equation (7).

In preparation for numbering the points associated with $E(C_1, GF(2^8))$, $[1]P, [2]P, [3]P, \ldots$ are sequentially calculated at each point $P$ of $E(C_1, GF(2^8))$, and such a positive integer that gives $[m_P]P=O$ for the first time is determined. One point where $m_P$ assumes a maximum value is selected, and expressed as $P^*$. In a specific example, max $m_P=96$, and $(\alpha^2, \alpha^{68})$ is an example of $P^*$. Then, such a $P^{}$ is searched for that satisfies the relations $m_{P^{}}=\epsilon\backslash m_{P^*}=3$ and $P^{} \neq [96/3]P$, $[2 \times 96/3]P$. In a specific example, $(\alpha^{60}, \alpha^{23})$ is an example of $P^{}$.

In the process, $\{[s]P^{**}+_o[u]P^* | 0 \leq s \leq 2, 0 \leq u \leq 95\}$ is calculated and written out, and thus it can be checked that it coincides with $E(C_1, GF(2^8))$. Especially, a point associated with $E(C_1, GF(2^8))$ can be numbered in the form of $[s]P^{**}+o[u]P^*(0 \leq s \leq 2, 0 \leq u \leq 95)$. $[s]P^{**}+_o[u]P^*$ is expressed as $P_{s,u}$, and $s$ and $u$ corresponding to each point on $E(C_1, GF(2^8))$ are calculated. In this way, the preparation for numbering is complete.

From the definition of $s$ and $u$, the mass of $(s, u)$ is given as a direct product group $G=Z/3Z \times Z/96Z$ of the residue class ring of integers. Also, the aforementioned numbering operation indicates that $E(C_1, GF(2^8))$ is isomorphic with $Z/3Z \times Z/96Z$ as a group.

In the description that follows, the points corresponding to the 1st, 2nd ..., 287th symbols as counted from the symbol counting reference position are expressed as $P^{(1)}$, $P^{(2)}, \ldots, P^{(287)}$, respectively.

Figure 4:
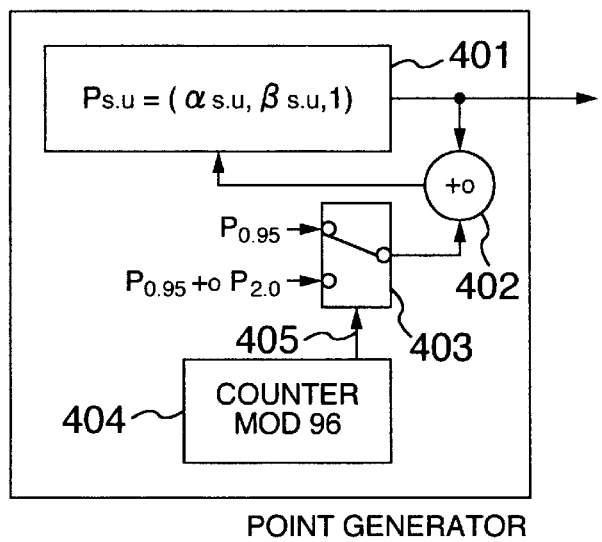
FIG. 4 is a block diagram showing a first specific example of configuration of the rational point generator of FIG. 3.

FIG. 4 is a schematic diagram showing a rational point generator in the case where the points associated with $E(C_1, GF(2^8))$ are numbered sequentially as $P^{(1)}, P^{(2)}, \ldots, P^{(287)}$ in the order indicated in equation (8).

$$P_{2,95}, P_{2,94}, \ldots, P_{2,1}, P_{2,0}; P_{1,95}, P_{1,94}, \ldots, P_{1,1}, P_{1,0}; P_{0,95}, P_{0,94}, \ldots, P_{0,2}, P_{0,1} \qquad (8)$$

Equation (8) is indicative of the fact that the subscript $(s,u)$ of $P_{s,u}$ corresponds to the symbol positions in lexicographic order. The counter 404 is for counting the period of descent (descending order) of subscripts from, for example, $P_{1,0}$ to $P_{0,95}$.

Figure 5:
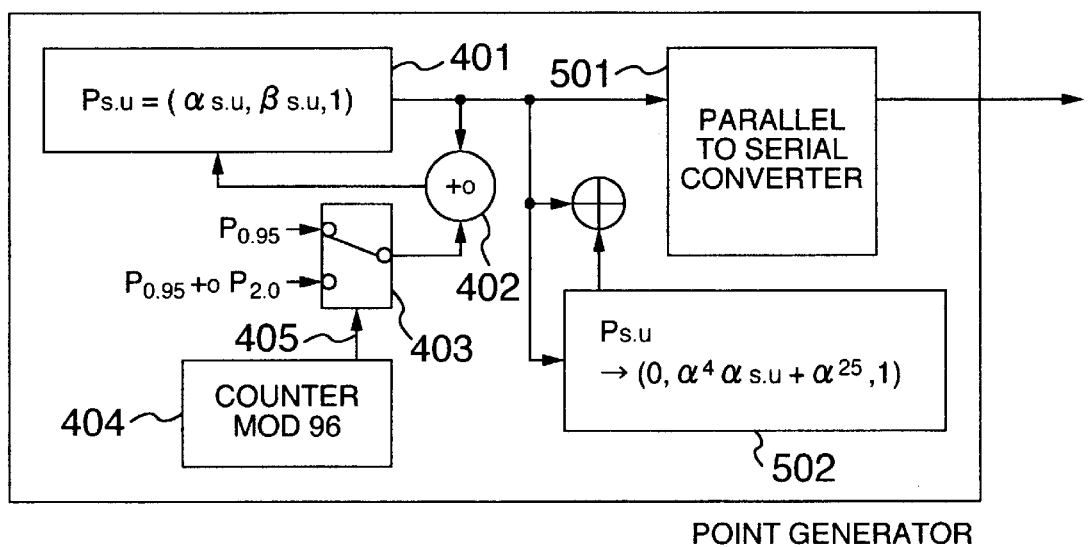
FIG. 5 is a block diagram showing a second specific example of configuration of the rational point generator of FIG. 3.

FIG. 5 is a schematic diagram showing an example configuration of the rational point generator in the case where the points associated with $E(C_1, GF(2^8))$ are numbered as $P^{(1)}, P^{(2)}, \ldots, P^{(287)}$ in the order indicated by equation (9). A part of the reference numerals designate the same component elements as the corresponding component elements in FIG. 4.

$$P_{1,95}, P_{2,1}; P_{1,94}, P_{2,2}; \ldots; P_{1,1}, P_{2,95}; P_{1,0}, P_{2,0}; P_{0,95}, P_{0,1}; P_{0,94}, P_{0,2}; \ldots; P_{0,49}, P_{0,47}; P_{0,48} \qquad (9)$$

The arithmetic circuit 502 calculates the difference of numerical value between the points $P_{s,u}$ and $P_{3-s,96-u}$ separated by semicolon in equation (9). From the manner in which $P^*$ and $P^{**}$ are determined and the expression of $P_{s,u}$, the relation holds that $P_{s,u}+_o P_{3-s,96-u}=o$. From equation (7), the difference between $P_{s,u}=(\alpha_{su}, \beta_{su})$ and $P_{3-s,96-u}$ is given as $(0, a_1 \alpha_{su}+a_3, 0)$ in the input/output format of the $+o$ arithmetic circuit.

Especially, the expression $P^{(j)}=(\alpha_j, \beta_j)$ satisfies the relation $\alpha_{2s+1}=\alpha_{2s+2}$.

After preparation of the foregoing process, the matrix M in the matrix calculation circuit 303, and the initial value of the memory for storing $P_{0,95}$, $P_{0,95}+_o P_{2,0}$ and the rational point in the rational point generator 301 indicating the symbol position are a fixed value, i.e. an encoded parameter, as far as the numbering of $P^{(1)}, P^{(2)}, \ldots, P^{(287)}$ is determined. The encoder can be configured by preparing, by calculation with a calculator or the like, the matrix M from equations (3), (4) on the one hand and the initial value of the memory for storing $P_{0,95}$, $P_{0,95}+_o P_{2,0}$ and the rational point from equation (7) (taking note of the fact that the relation $P_{0,1}=P^*$, $P_{1,0}=P^{**}$ holds from the manner in which $P^*$ and $P^{**}$ are determined and the expression of $P_{s,u}$).

Figure 6:
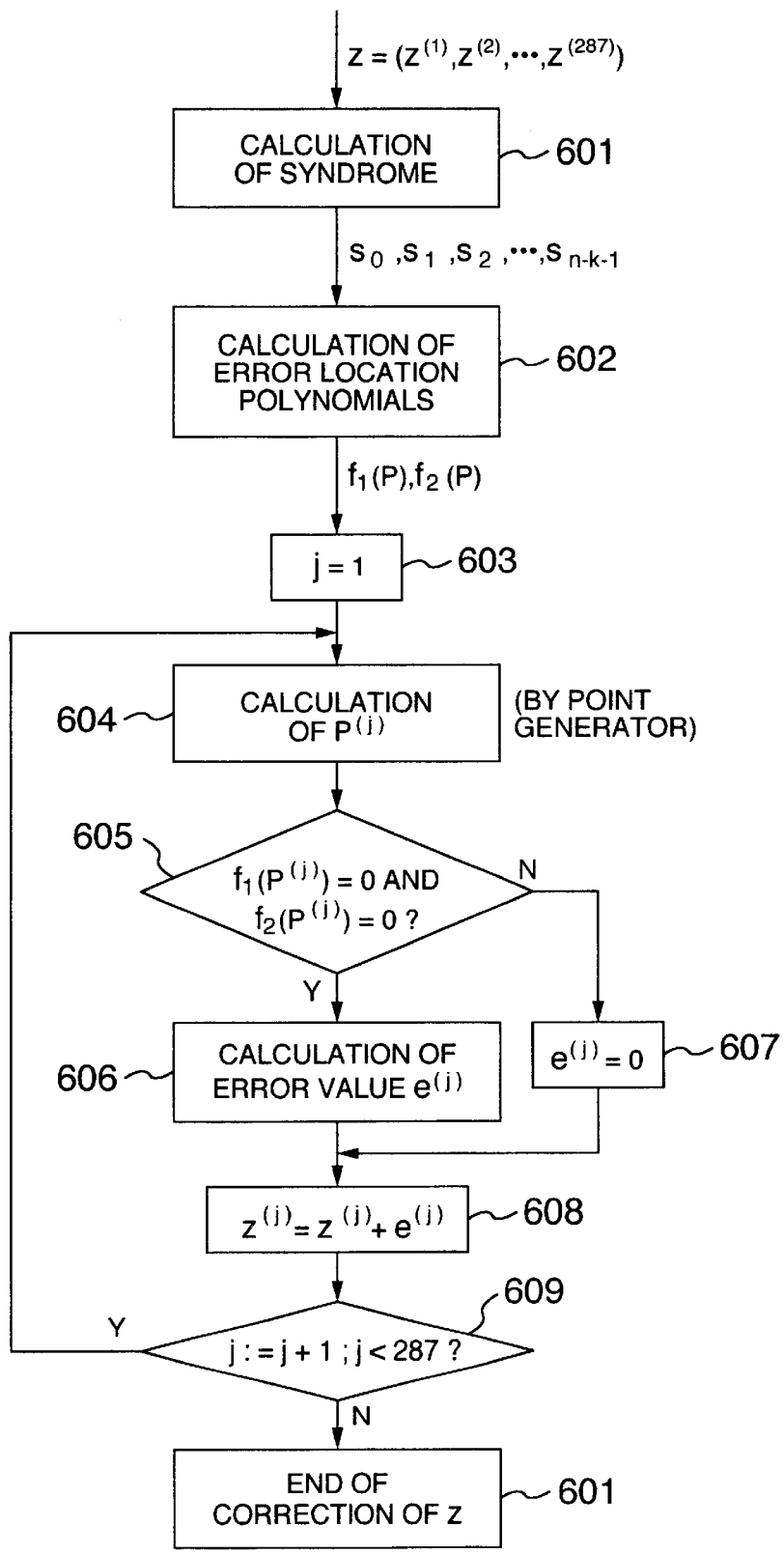
FIG. 6 is a flowchart showing the flow of the error detection/correction process of the elliptic decoding circuit of FIG. 1.

Now, an explanation will be given of an example of error detection and correction with utilizing an elliptic code. FIG. 6 shows the flow of the process for error detection and correction of the elliptic code. An error syndrome $s_0, s_1, s_2, \ldots, s_{n-k-1}$ is calculated by a syndrome calculation circuit 601 for calculating the syndrome providing such a mass of check sums as to assume zero in the absence of an error from the input. Then, the error location polynomials $f_1(P)$, $f_2(P)$ are calculated by the error location polynomial calculation circuit 602 from the error syndrome. The error is located by the Chien search thereby to determine the magnitude of the error at the error location. This process corresponds to steps 603 to 609.

Figure 7:
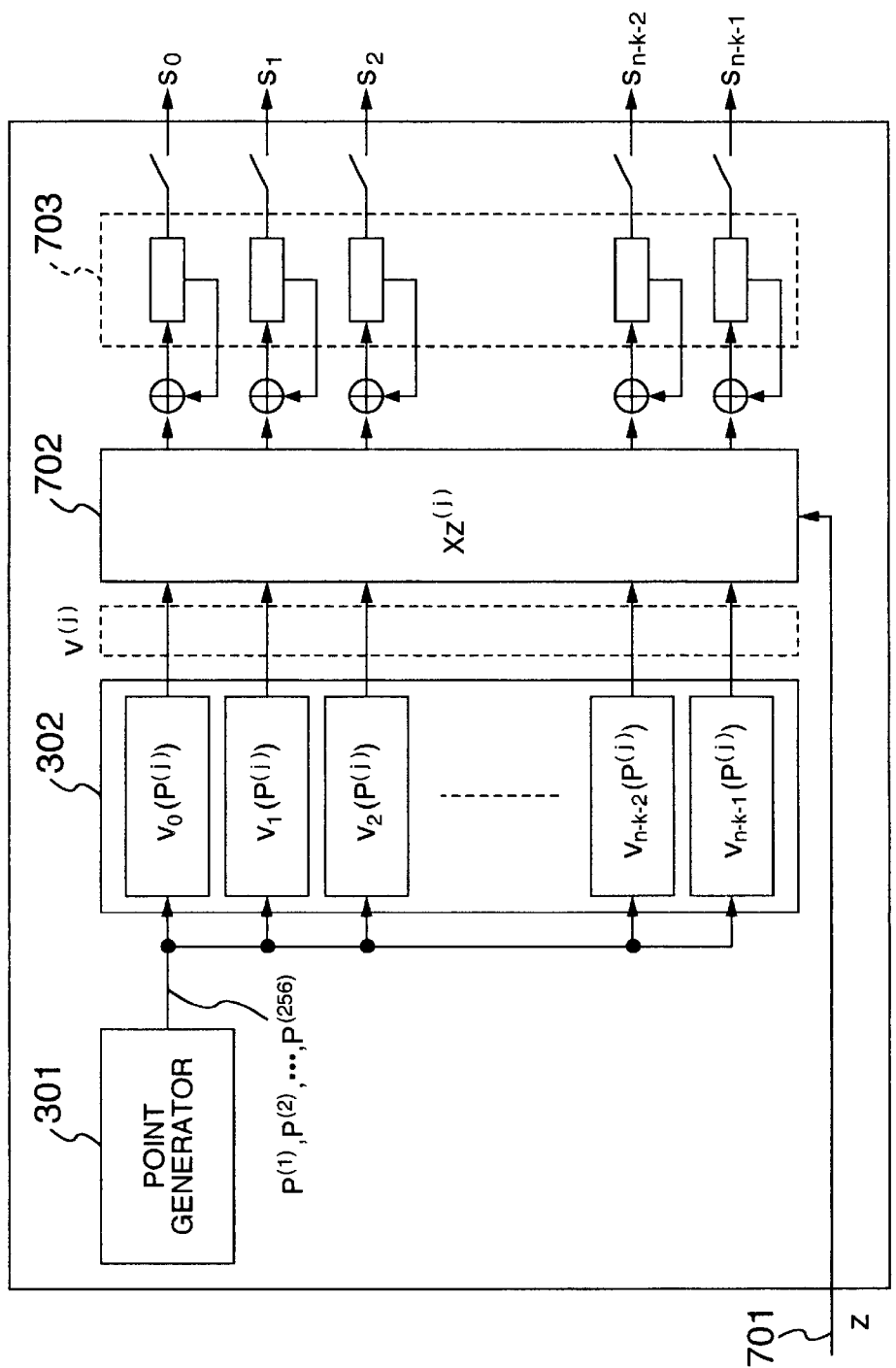
FIG. 7 is a block diagram showing an example of a syndrome calculation circuit in the elliptic decoding circuit of FIG. 1.

FIG. 7 is a schematic diagram showing the syndrome calculation circuit 601. An input symbol train $z^{(1)}, z^{(2)}, \ldots, z^{(287)}$ is input from an input terminal 304. The rational point generator 301 outputs a point $P^{(j)}$ at the timing of input of $z^{(j)}$. With the point $P^{(j)}$ as an input, the vector generating circuit 302 outputs a vector $v^{(j)}$. With the vector $v^{(j)}$ and the symbol $z^{(j)}$ as an input, the scalar multiplier 704 outputs $z^{(j)} v^{(j)}$, which is then added to and stored in the memory 705 for storing the syndrome. After complete processing for 256 symbols, the result is output as an error syndrome $s_0, s_1, s_2, \ldots, s_{n-k-1}$.

Figure 8:
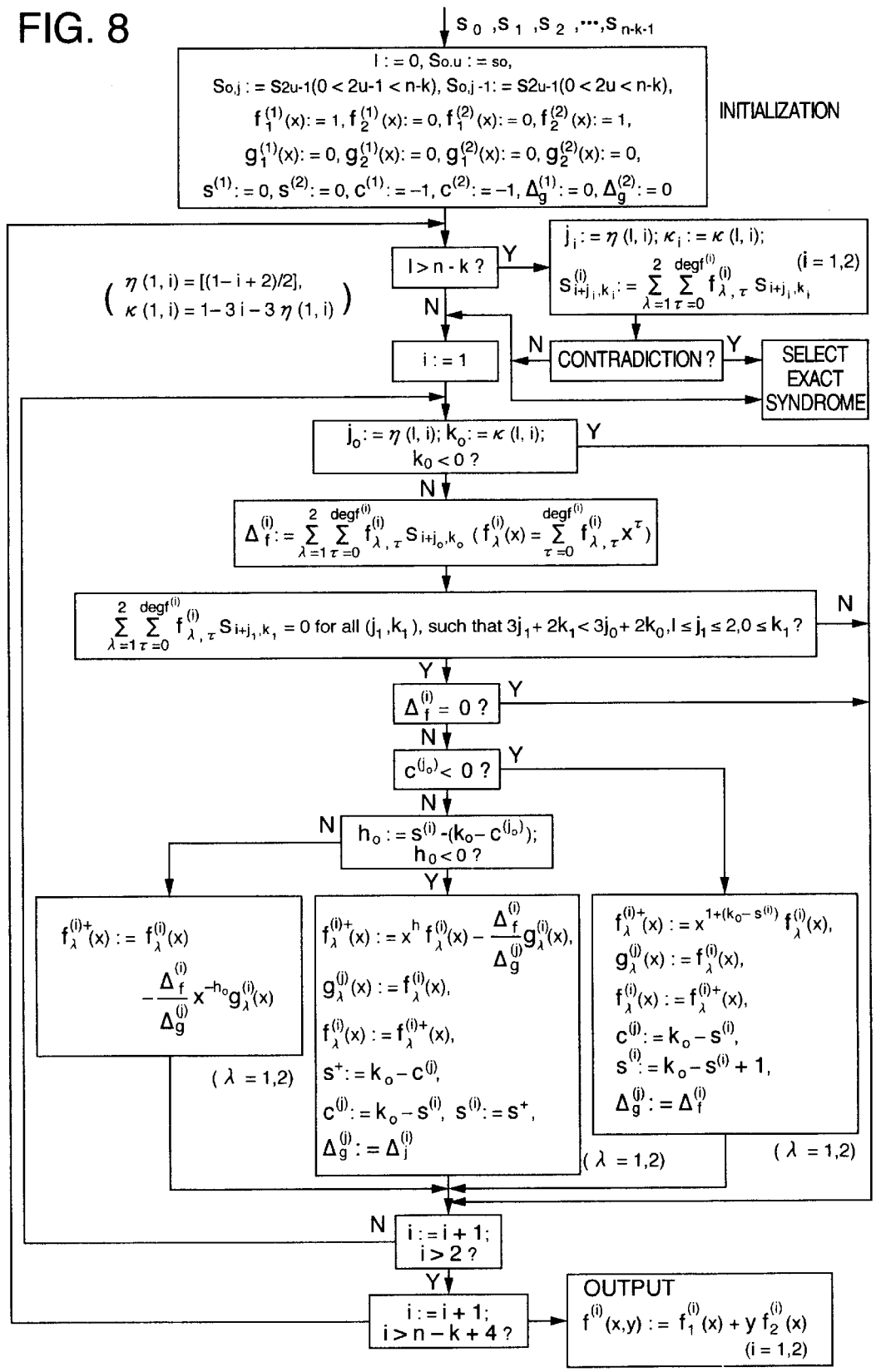
FIG. 8 is a flowchart showing the flow of the process in an error location polynomial calculation circuit in the elliptic decoding circuit of FIG. 7.

FIG. 8 shows the flow of the process in the error location polynomial calculation circuit 602. This diagram shows an example of application to the elliptic code of the process called the Barlekamp-Massey-Sakata algorithm (see S. Sakata, "Algebraic Geometrical Codes and the Method of Decoding Thereof", Mathematical Science, No. 421, pp. 33–40, No. 422, pp. 58–65, 1998; and S. Sakata, "A Vector Version of the BMS Algorithm for Implementing Fast Erasure-and-Error Decoding of One-Point AG codes", Proc. AAECC-12, Springer Verlag, pp. 292–310, 1997).

The calculation 606 of the error value $e^{(j)}$ in FIG. 6 is carried out according to equation (10).

$$\sum_{a=0}^{2^8-2}\sum_{b=0}^{2^8-2} S_{ab}x(P^{(j)})^{-a}y(P^{(j)})^{-b} \qquad (10)$$

The foregoing description refers to a magnetic disk device as an example. Nevertheless, the present invention is of course applicable also to the recording and reproduction of data in a recording medium of other types as well as the magnetic disk device.

According to this invention, the use of the elliptic code makes it possible to reduce the number of redundant bits as compared with the Reed-Solomon code. Specifically, assuming that m is a positive integer and an even number of more than 3, a code having the length of $2^m+2^{1+m/2}$ in maximum can be configured by the error correction and coding using the elliptic code on a finite field $GF(2^m)$. By use of the code having this length, a sector of 512 bytes can be configured in two interleaves.

In the magnetic disk device, the number of redundant bits can be reduced as compared with the Reed-Solomon code in which a sector of 512 bytes can be configured in two interleaves. Assume, for example, that the error correcting coding operation can be performed in such a manner as to correct the random error of 15 symbols in maximum. Then, the following result of comparison is obtained.

In the case of the Reed-Solomon code, the field on $GF(2^8)$ cannot be used but $GF(2^9)$ or larger field is required due to the limit of the code length. The maximum number t of corrected symbols is 15, and therefore in the case of the code on $GF(2^9)$, 30 (=15×2) redundant symbols of 9 bits are added. Thus, a total of 270 (=30×9) redundant bits are added.

In the case of the elliptic code, on the other hand, the code on $GF(2^8)$ can be used. In this case, the maximum number t of corrected symbols is 15, and therefore in the case of the code on $GF(2^8)$, 31 (=15×2+1) redundant symbols of 8 bits are added. Thus, a total of 248 (=31×8) redundant bits are added. As a result, it is seen that the number of redundant bits of the elliptic code can surely be reduced as compared with the Reed-Solomon code.

What is claimed is:

1. A recording/reproducing apparatus for recording in a recording medium the interleaved data with an error correcting code added thereto and reproducing the recorded data from said recording medium, the apparatus comprising an error correcting coding circuit for generating an error correcting code using an elliptic code on a finite field $GF(2^m)$ where m is a positive integer, wherein a length of said elliptic code is longer than $2^m-1$ and not more than $2^m+2^{1+m/2}$.

2. A recording/reproducing circuit according to claim 1, wherein said coding circuit uses an elliptic code in which the length n of the data encoded for each interleave is not less than $2^m$ and the number t of correctable symbols holds the relation $m/2<t\leq 2^{m/2}$.

3. A recording/reproducing apparatus comprising:
an interface for converting an input signal to binary data;
an interleaver for segmenting the converted binary data into a plurality of data blocks;
a coding circuit for performing the error correcting coding operation for each of said data blocks using an elliptic code on a finite $GF(2^m)$ where m is a positive integer, wherein a length of said elliptic code is longer than $2^m-1$ and not more than $2^m+2^{1+m/2}$;
a signal processing circuit for converting the data block subjected to the error correcting coding operation into an analog signal for recording in a recording medium, and converting the analog signal read from said recording medium into binary data; and
a decoding circuit for detecting and correcting an error of the binary data converted by said signal processing circuit using said elliptic code.

4. A recording/reproducing circuit according to claim 3, wherein said coding circuit uses an elliptic code in which the length n of the data encoded for each interleave is not less than $2^m$ and the number t of correctable symbols holds the relation $m/2<t\leq 2^{m/2}$.

5. An error correcting coding method wherein assuming that the reference position for counting symbols is the most significant order or the least significant order of the code and that in the case where a point on an elliptic curve corresponding to the jth symbol position as counted from the reference position is $p^{(j)}=(\alpha_j, \beta_j)$, the values $p^{(1)}$, $p^{(3)}$, $p^{(5)}, \ldots, p^{(n)}$, where n is an integer, are arranged continuously in ascending or descending lexicographic order of the direct product group G of the residue class ring of integers isomorphic with the elliptic curve as a group.

6. An information recording method comprising:
converting an input signal to binary data;
segmenting the converted binary data to data blocks;
subjecting each of said data blocks to the error correcting coding operation using an elliptic code on a finite field $GF(2^m)$ where m is a positive integer, wherein a length of said elliptic code is longer than $2^m-1$ and not more than $2^m+2^{1+m/2}$,
converting the data block subjected to the error correcting coding operation to an analog signal; and
recording the data block converted to the analog signal in a recording medium.

7. An error correcting coding method wherein assuming that the reference position for counting symbols is the most significant order or the least significant order of the code and that in the case where a point on an elliptic curve corresponding to the jth symbol position as counted from the reference position is $p^{(j)}=(\alpha_j, \beta_j)$, the values $p^{(1)}$, $p^{(3)}$, $p^{(5)}, \ldots, p^{(2s+1)}$, where s an integer, and 2s+1 is n or n−1, are arranged continuously in ascending or descending lexicographic order of the direct product group G of the residue class ring of integers isomorphic with the elliptic curve, and the relation holds that $\alpha_{2s+1}=\alpha_{2s+2}$ for $1<2s+2\leq n$.

* * * * *